(12) United States Patent
Feustel et al.

(10) Patent No.: US 8,357,610 B2
(45) Date of Patent: Jan. 22, 2013

(54) REDUCING PATTERNING VARIABILITY OF TRENCHES IN METALLIZATION LAYER STACKS WITH A LOW-K MATERIAL BY REDUCING CONTAMINATION OF TRENCH DIELECTRICS

(75) Inventors: Frank Feustel, Dresden (DE); Thomas Werner, Moritzburg (DE); Michael Grillberger, Radebeul (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 534 days.

(21) Appl. No.: 12/355,112

(22) Filed: Jan. 16, 2009

(65) Prior Publication Data
US 2009/0243116 A1    Oct. 1, 2009

(30) Foreign Application Priority Data
Mar. 31, 2008   (DE) .......................... 10 2008 016 424

(51) Int. Cl.
*H01L 21/308* (2006.01)
*H01L 21/768* (2006.01)
(52) U.S. Cl. .................... 438/637; 438/638; 438/643
(58) Field of Classification Search .................. 438/618, 438/627, 653, E21.579, 637–643
See application file for complete search history.

(56) References Cited

U.S. PATENT DOCUMENTS

| | | | |
|---|---|---|---|
| 6,004,883 A | 12/1999 | Yu et al. | 438/706 |
| 6,040,243 A | 3/2000 | Li et al. | 438/687 |
| 6,566,283 B1 | 5/2003 | Pangric et al. | 438/788 |
| 6,812,145 B2 | 11/2004 | Ma | 438/653 |
| 6,878,615 B2 * | 4/2005 | Tsai et al. | 438/618 |
| 7,005,390 B2 | 2/2006 | RamachandraRao | 438/778 |
| 2007/0001306 A1 | 1/2007 | Su et al. | 257/758 |
| 2007/0218679 A1 | 9/2007 | Schneider et al. | 438/638 |

FOREIGN PATENT DOCUMENTS

| | | |
|---|---|---|
| DE | 199 27 284 A1 | 2/2001 |
| WO | WO 00/39849 | 7/2000 |
| WO | WO 2005/109490 A1 | 11/2005 |

OTHER PUBLICATIONS

Translation of Official Communication from German Patent Office for German Patent Application No. 10 2008 016 424.0 dated Nov. 27, 2008.

* cited by examiner

*Primary Examiner* — Cuong Q Nguyen
(74) *Attorney, Agent, or Firm* — Williams, Morgan & Amerson, P.C.

(57) ABSTRACT

By forming a protection layer prior to the application of the planarization layer during a dual damascene strategy for first patterning vias and then trenches, enhanced etch fidelity may be accomplished. In other aspects disclosed herein, via openings and trenches may be patterned in separate steps, which may be accomplished by different etch behaviors of respective dielectric materials and/or the provision of an appropriate etch stop layer, while filling the via opening and the trench with a barrier material and a highly conductive metal may be achieved in a common fill sequence. Hence, the via opening may be formed on the basis of a reduced aspect ratio, while nevertheless providing a highly efficient overall process sequence.

21 Claims, 7 Drawing Sheets

REDUCING PATTERNING VARIABILITY OF TRENCHES IN METALLIZATION LAYER STACKS WITH A LOW-K MATERIAL BY REDUCING CONTAMINATION OF TRENCH DIELECTRICS

BACKGROUND OF THE INVENTION

1. Field of the Invention

Generally, the present disclosure relates to the fabrication of integrated circuits, and, more particularly, to the formation of metallization layers of reduced permittivity by using low-k dielectric materials.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and a plurality of inter-level connections, also referred to as vias, which provide the electrical connection between two neighboring stacked metallization layers, wherein the metal-containing lines and vias may also be commonly referred to as interconnect structures.

Due to the ongoing demand for shrinking the feature sizes of highly sophisticated semiconductor devices, highly conductive metals, such as copper and alloys thereof, in combination with a low-k dielectric material, have become a frequently used alternative in the formation of metallization layers. Typically, a plurality of metallization layers stacked on top of each other is necessary to realize the connections between all internal circuit elements and I/O (input/output), power and ground pads of the circuit design under consideration. For extremely scaled integrated circuits, the signal propagation delay, and thus the operating speed, of the integrated circuit may no longer be limited by the field effect transistors but may be restricted, owing to the increased density of circuit elements requiring an even more increased number of electrical connections, by the close proximity of the metal lines, since the line-to-line capacitance is increased, which is accompanied by the fact that the metal lines have a reduced conductivity due to a reduced cross-sectional area. For this reason, traditional dielectrics, such as silicon dioxide (k>3.6) and silicon nitride (k>5), are replaced by dielectric materials having a lower dielectric constant k, which are therefore also referred to as low-k dielectrics, having a relative permittivity of 3.0 or less. The reduced permittivity of these low-k materials is frequently achieved by providing the dielectric material in a porous configuration, thereby offering a k value of significantly less than 3.0. Due to the intrinsic properties, such as a high degree of porosity, of the dielectric material, however, the density and mechanical stability or strength may be significantly less compared to the well-approved dielectrics silicon dioxide and silicon nitride.

During the formation of copper-based metallization layers, a so-called damascene or inlaid technique is usually used, due to copper's characteristic of substantially not forming volatile etch products when being exposed to well-established anisotropic etch ambients. In addition, copper also may not be deposited with high deposition rates on the basis of well-established deposition techniques usually used for aluminum, such as chemical vapor deposition (CVD). Thus, in the inlaid technique, therefore, the dielectric material is patterned to receive trenches and/or vias, which are subsequently filled with the metal by an efficient electrochemical deposition technique. Moreover, a barrier layer is usually to be formed on exposed surface portions of the dielectric material prior to filling in the metal, which provides the desired adhesion of the metal to the surrounding dielectric material and also suppresses copper diffusion into sensitive device areas, as copper may readily diffuse in a plurality of dielectric materials, in particular in porous low-k dielectrics.

In some conventional approaches, the process of filling in a conductive metal, such as copper, may be accomplished in a so-called dual damascene strategy, in which the via opening, connecting to an underlying metal region, and a corresponding trench may be filled in a common deposition process, thereby enhancing the overall process efficiency. For this purpose, contrary to single damascene process techniques, in which a first portion of the dielectric material may be deposited and may be subsequently patterned so as to receive a via, which is then filled by the metal material, followed by the deposition of a further layer portion that receives the metal line, the via opening and the trench are formed in the dielectric material of the respective metallization layer and subsequently the barrier material and the copper material are filled in a common process sequence. For example, after the deposition of an appropriate dielectric material, for instance a low-k dielectric material, which may be provided at least partially as a porous low-k dielectric material, a patterning sequence is performed, wherein, in some illustrative approaches, the via opening is formed first, followed by a patterning of a trench in the upper portion of the dielectric material. Consequently, in this approach, the patterning of the trenches has to be accomplished on the basis of a surface topography including the previously formed via openings, which may be accomplished by planarizing the surface topography prior to lithographically patterning an etch mask for the trench etch process. Upon a continuous shrinkage of the overall feature sizes of sophisticated semiconductor devices, it appears, however, that the etch fidelity during the patterning of trenches, in particular at locations around the previously formed via openings, may be reduced, thereby also resulting in a reduced performance of the finally-obtained metallization system, as will be described in more detail with reference to FIGS. 1a-1d.

Figure 1A:
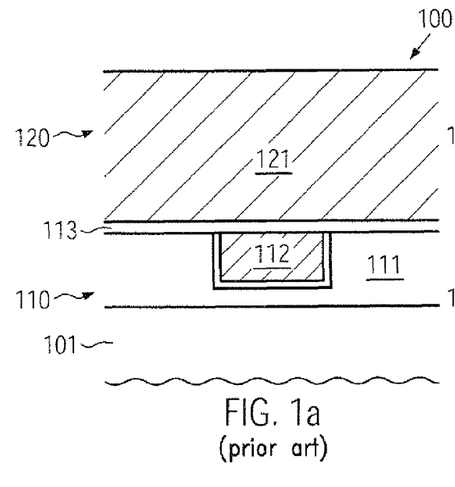
FIGS. 1a-1d schematically illustrate cross-sectional views of a conventional semiconductor device during various manufacturing stages in patterning a dielectric material of a metallization layer according to well-established dual damascene strategies in which the via opening is formed first, followed by the trench.

FIG. 1a schematically illustrates a cross-sectional view of a semiconductor device 100 in an advanced manufacturing stage, in which one or more metallization layers are to be formed above a device level of the semiconductor device 100. In the manufacturing stage shown, the semiconductor device 100 comprises a substrate 101, which, for convenience, is to be considered as an appropriate carrier material having formed thereon one or more material layers for receiving semiconductor circuit elements, such as transistors, capacitors, resistors and the like, which, for convenience, are not shown in FIG. 1a. For instance, the substrate 101 may represent a semiconductor material, for instance, a silicon material in combination with an appropriate silicon-based layer in and above which transistor elements may be formed. In other cases, a buried insulating layer (not shown) may be formed between the substrate material and the corresponding "active" silicon-based material layer, thereby providing a silicon-on-insulator (SOI) configuration. The circuit elements provided in the device level of the semiconductor device 100 may have critical dimensions of approximately 50 nm and less, depending on the device requirement. Above the substrate 101, including the semiconductor circuit elements, a metallization system is provided which may be represented by a first metallization layer 110 comprised of a dielectric material 111, which may be provided in the form of a conventional dielectric material, such as silicon dioxide, silicon nitride, silicon oxynitride and the like, depending on the overall device and process requirements. In sophisticated applications, the dielectric material 111 may comprise a low-k dielectric material to reduce the overall parasitic capacitance between adjacent metal regions. Furthermore, the metallization layer 110 may comprise a metal region, for instance, in the form of a metal line 112 which may comprise a highly conductive metal, such as copper, in combination with a barrier material, which in turn may include two or more layers, such as tantalum, tantalum nitride and the like, in order to obtain the desired barrier and adhesion effect. For example, tantalum nitride may provide enhanced adhesion to the surrounding dielectric material, while tantalum may provide superior copper diffusion blocking effects while also endowing enhanced mechanical stability to the copper material of the metal region 112. The metallization layer 110 may further include a cap layer 113, which may be comprised of silicon nitride, silicon carbide, nitrogen-containing silicon carbide and the like, wherein the cap layer 113 may act as an etch stop layer during the further processing of the device 100 and may also confine the metal line 112, for instance, in view of undue copper diffusion and any interaction of reactive components, such as oxygen, fluorine, with the highly reactive copper material in the metal line 112.

Furthermore, in the manufacturing stage shown, a further metallization layer 120 may be provided in an initial stage, that is, a dielectric material 121 is provided with appropriate material characteristics and a desired thickness so as to receive a via opening and a trench in a subsequent manufacturing stage. For instance, in sophisticated applications, the dielectric material 121 may comprise a low-k dielectric material having a reduced density, for instance, provided by a porous structure so as to obtain moderately low values for the dielectric constant, as may be required for further reducing the overall signal propagation delay in the metallization system of device 100.

Typically, the device 100 as shown in FIG. 1*a* may be formed on the basis of well-established process techniques. For example, the circuit elements (not shown) may be formed on the basis of well-established sophisticated process techniques so as to obtain the circuit elements with feature sizes as required by design rules of the technology node under consideration. After forming an appropriate contact structure (not shown), that is, an inter-layer dielectric material having a planarized surface topography for enclosing and passivating the circuit elements, including appropriate conductive elements connecting to contact areas of the circuit elements, the one or more metallization layers 110, 120, may be formed. For this purpose, the dielectric material 111 may be deposited and may be subsequently patterned to receive vias and/or trenches, followed by the deposition of the barrier material 112 which may be accomplished by sputter deposition, CVD and the like. It should be appreciated that the metallization layer 110 may be formed by similar process techniques, as will be described with reference to the metallization layer 120, depending on the overall process strategy. Thereafter, the metal, such as copper, may be filled in, for instance, by electroplating, where, prior to the electrochemical deposition process, a conductive seed layer, such as a copper layer, may be formed by appropriate deposition techniques, such as sputter deposition, electroless plating and the like. After filling in the copper material, any excess material thereof may be removed, for instance, by electrochemical etching, chemical mechanical polishing (CMP) and the like. Next, the cap layer 113 may be formed by depositing one or more appropriate materials, such as the materials previously explained, on the basis of well-established plasma enhanced chemical vapor deposition (PECVD) techniques. Subsequently, the dielectric material 121 may be formed by any appropriate deposition technique, such as CVD, spin-on processes and the like, which may be accompanied by further reducing the relative permittivity of the material 121 by a subsequent treatment so as to create enhanced porosity therein, for instance, by incorporating an appropriate material, so-called porogens, which may result in enhanced porosity after treating the material 121, for instance, by heat, radiation and the like. For this purpose, well-established process recipes are available. Consequently, due to the significantly reduced relative permittivity, which is typically associated with a reduced density of the dielectric material under consideration, which may be even further enhanced by a desired high degree of porosity, the material 121 may suffer from increased diffusion of more or less volatile components that may come into contact with the material 121 at subsequent process stages.

Figure 1B:
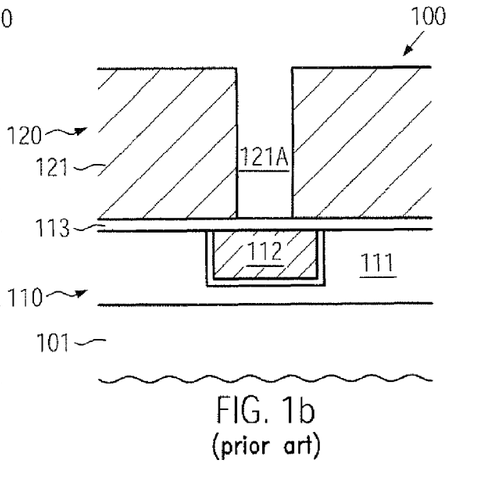

FIG. 1*b* schematically illustrates the semiconductor device 100 in a further advanced manufacturing stage in which a via opening 121A is formed on the dielectric material 121. For this purpose, sophisticated patterning regimes are typically applied, which involve the deposition of any appropriate materials, such as anti-reflective coating (ARC) materials, resist materials and the like, which may then be lithographically patterned to form an appropriate etch mask for a subsequent anisotropic etch process. That is, during the actual etch process, sophisticated conditions may be encountered wherein the aspect ratio of the opening 121A may be substantially determined by the thickness of the layer 121 in combination with the thickness of any mask material, such as the ARC material, which may act as a hard mask, and the resist material, depending on the overall process strategy. For example, for a lateral dimension of the opening 121A of approximately 200 nm or even less, and for a thickness of the layer 121, in combination with the thickness of the mask material, which may be in the range of several hundred nanometers or more, the aspect ratio, i.e., the ratio of the depth of the opening 121A and the lateral dimension thereof, may be 5 or even more, depending on the overall process requirements. Consequently, the etch process, which may be controlled on the basis of the cap layer 113, may require enhanced overall process control in order to obtain the openings 121A so as to comply with design rules. Moreover, after removal of the etch mask, the surface topography of the metallization layer 120 may comprise a plurality of high aspect ratio openings, such as the openings 121A, which may also represent a challenge for a subsequent critical patterning process for forming trenches in an upper portion of the dielectric material 121.

Figure 1C:
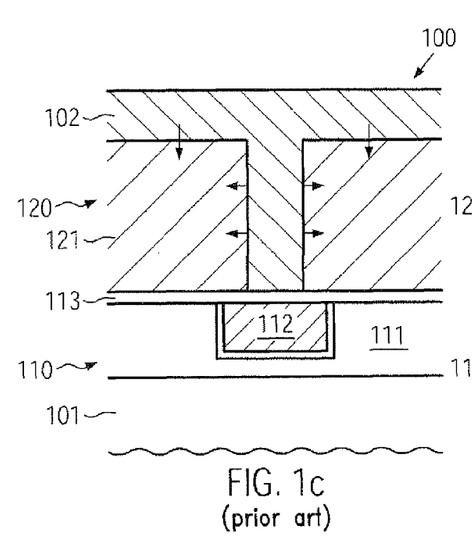

FIG. 1*c* schematically illustrates the semiconductor device 100 with a planarization layer 102 formed in the via opening 121A and on the dielectric material 121. According to well-established process techniques, the planarization layer 102 may be comprised of an organic material, such as a polymer material and the like, which may be deposited on the basis of a highly non-conformal deposition technique, such as spin-on techniques, possibly in combination with further planarization steps, such as CMP, in order to fill the opening 121A and also provide enhanced surface conditions during the subsequent lithography process, in which a resist material may be provided to form a mask for a trench to be etched into the upper portion of the dielectric material 121. The planarizalayer 102, which may also act as an ARC material, may be in direct contact with the dielectric material 121. During the interaction of these materials, it is believed that components, such as the solvent of the organic planarization layer, may diffuse into the dielectric material 121, in particular when a more or less porous structure thereof may have a reduced diffusion blocking effect.

Figure 1D:
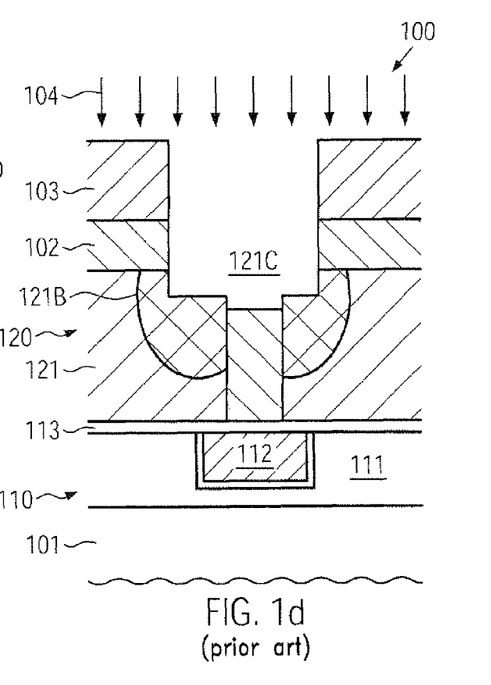

FIG. 1d schematically illustrates the semiconductor device 100 in a further advanced manufacturing stage in which an etch mask 103 is used for patterning the planarization layer 102 and the underlying dielectric material 121 during an etch process 104. As previously discussed, for sophisticated devices, a width of a trench 121C may be on the order of magnitude of several hundred nanometers to approximately 100 nanometers and less, depending on the device level and the technology node under consideration. Since the lateral width and the depth of the trench 121C represent important aspects for adjusting the overall performance of the metal line to be formed in the trench 121C, enhanced process control is required to obtain uniform metallization characteristics. That is, the width and depth of the trench 121C substantially determine the cross-sectional area of a respective metal line, the performance of which is substantially determined by the characteristics of the metal to be filled in, the electromigration performance of respective interfaces and the cross-sectional area available for conducting current in the respective metal line. As previously indicated, increased diffusion of components of the planarization material 102 into the volume of the dielectric material 121, in particular in the vicinity of the via opening 121A, as indicated by a portion 121B, may result in a non-uniform etch behavior, thereby resulting in a less predictable fidelity during the etch process 104 which might finally translate into reduced performance of the respective metallization systems, in particular when sophisticated semiconductor devices are considered that are formed on the basis of low-k dielectric materials having an enhanced degree of porosity while also requiring metal lines and vias of reduced lateral dimensions.

After finishing the etch process 104 and removing the etch mask 103 and the planarization material 102 and opening the cap layer 113 within the via opening 121A, an appropriate barrier material, such as tantalum nitride in combination with tantalum, may be deposited and subsequently copper may be filled in in a common process sequence, thereby efficiently forming a via and a metal line on the basis of the opening 121A and the trench 121C. However, as indicated above, although an efficient process flow may be accomplished by using the above-described sequence, increased variability of metal line characteristics may be observed, in particular in combination with low-k dielectric materials having a porous structure, which may render these techniques including a common metal fill process as less attractive in view of further device scalability.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is related to a technique for forming metallization systems in a highly efficient manner by filling via openings and trenches in a common fill process, while reducing negative effects during the patterning of the via opening and the trenches. To this end, an interaction of a planarization material with an underlying low-k dielectric material, possibly a porous low-k dielectric material, may be reduced or substantially completely avoided to enhance the patterning process for forming respective trenches. Without intending to restrict the present disclosure to the following explanation, it is believed that a significant interaction, i.e., diffusion of components of the organic planarization material into the low-k dielectric material of reduced density may result in non-uniformities during the etch process for patterning the trenches, which may cause significant variations of characteristics of the finally obtained metallization system. For this reason, in some illustrative aspects disclosed therein, an interaction of the organic planarization material with the low-k dielectric material may be reduced or substantially completely avoided by providing, at least temporarily, a protection layer of increased density prior to actually applying the planarization material. Consequently, the subsequent trench patterning process may be performed on the basis of enhanced etch uniformity, thereby obtaining superior characteristics of the metal lines. In other illustrative aspects disclosed herein, a contact of a planarization material with the low-k dielectric material may be avoided by first patterning the via opening in a first sub-layer of the dielectric material and forming the trench in a second sub-layer, while the via opening and the trench are then commonly filled within a common fill process. Thus, in addition to avoiding an interaction of a planarization material and the low-k dielectric material, less demanding conditions may be used during the patterning of the via opening, due to the reduced thickness of the first sub-layer, thereby even further enhancing the overall patterning efficiency, while still maintaining a highly efficient process, as both the via opening and the trench may be filled in a common deposition sequence.

One illustrative method disclosed herein comprises forming a via opening in a low-k dielectric layer that is formed above a substrate of a semiconductor device. The method further comprises forming a cap layer on exposed surface portions of the low-k dielectric layer and the via opening. Furthermore, a planarization layer is formed on the cap layer and a trench is formed in the low-k dielectric layer on the basis of the planarization layer.

A further illustrative method disclosed herein comprises forming a via opening in a first dielectric material of a metallization layer of a semiconductor device. Moreover, a second dielectric material is formed above the first dielectric material, wherein the second dielectric material fills the via opening. Furthermore, the method comprises forming a trench in the second dielectric material so as to connect to the via opening and filling the trench and the via opening with a metal in a common fill process.

One illustrative semiconductor device disclosed herein comprises a metal region formed in a first dielectric material of a metallization structure. The semiconductor device further comprises a via, at least partially formed, in a second dielectric material and connected to the metal region, wherein the via comprises, at least on a portion of sidewalls thereof, a dielectric liner comprised of a dielectric material other than the first and second dielectric materials.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to techniques and the respective semiconductor devices in which the patterning sequence for forming metallization layers may be enhanced by reducing or avoiding negative effects of a planarization material on the dielectric material, in particular on a porous low-k dielectric material, while nevertheless maintaining a highly efficient overall process flow, by filling the via opening and the trench in a common deposition sequence. To this end, the direct contact of a planarization material and the low-k dielectric material may be avoided by providing an intermediate protection layer of increased density and, thus, of enhanced diffusion blocking effect with respect to components of the planarization material, while, in other cases, the employment of a planarization material may be avoided by providing the dielectric material of the metallization layer under consideration in the form of respective sub-layers, which may be patterned separately, while nevertheless maintaining a common fill process. While, in the former aspect, a high degree of compatibility with conventional process techniques may be maintained while nevertheless providing enhanced etch fidelity during the trench patterning process, the latter aspect may additionally provide enhanced efficiency during the via patterning process, since the via opening may be formed with a reduced aspect ratio compared to conventional strategies, thereby significantly relaxing any patterning-related constraints. The separate patterning of the via opening and the trench may be accomplished by using low-l dielectric materials of different etch behavior and/or by providing an intermediate etch stop layer which may also further enhance the overall process uniformity, for instance, in view of obtaining a desired depth of the metal lines under consideration.

Moreover, as will be described later in more detail, the provision of a protection layer or etch stop layer may also provide enhanced flexibility in designing the overall patterning regime and adjusting characteristics of the metallization system, for instance, by providing the protection layer in the form of a conductive material or a dielectric material of well-defined thickness, which may result in enhanced integrity of trenches during opening the protection layer so as to connect to a metal region, since, after having formed the via opening and the trench, the last etch step for removing the bottom portion of the via opening may be performed on the basis of a moderately thin and well-defined layer thickness of the protection layer, thereby not unduly exposing the trench and the vias to a reactive etch ambient. Furthermore, in other cases, the via opening may be completely opened prior to forming the respective trenches and subsequently a conductive protection layer may be formed, which may thus passivate an exposed metal surface and may be maintained during the further processing.

As a consequence, the principles disclosed herein provide increased process flexibility in combination with enhanced process and device uniformity, while nevertheless enabling a highly efficient overall process sequence by filling via openings and trenches during a common fill process.

Figure 2A:
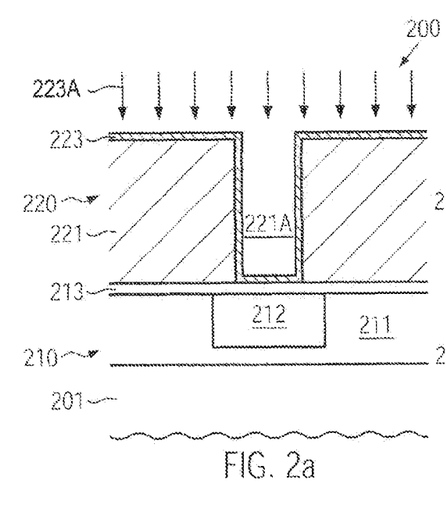
FIGS. 2a-2e schematically illustrate cross-sectional views of a semiconductor device during the manufacturing process for forming a metallization layer by reducing the interaction of a planarization material with a low-k dielectric material on the basis of a protection layer, according to illustrative embodiments.

FIG. 2a schematically illustrates a cross-sectional view of a semiconductor device 200, which may comprise a substrate 201 representing any appropriate substrate for the formation of circuit elements therein and thereon. For example, the substrate 201 may represent a bulk silicon substrate, an SOI substrate, or any other suitable carrier material having formed thereon a semiconductor layer (not shown) appropriate for the formation of circuit elements, such as transistors, capacitors, resistors and the like. As previously explained in the context of the device 100, respective circuit elements, such as field effect transistors, may have feature sizes of approximately 50 nm and less in sophisticated applications, thereby also requiring reduced features sizes in a metallization system of the device 200. In the embodiment shown, the semiconductor device 200 may comprise a contact region 212, for instance, in the form of a metal region, such as a metal line and the like, which is to be contacted by a metallization layer 220. For example, the contact region 212 may be embedded into a dielectric material 211 of a device layer or metallization layer 210, depending on the overall device configuration. For instance, the contact region 212 may represent a contact region of a semiconductor element or may represent a metal-containing region connecting to a contact element, while, in other cases, the contact region 212 may represent a metal line of the very first metallization layer or any intermediate metallization layer and the like. For instance, the dielectric material 211 may be provided in the form of a conventional dielectric material, such as silicon dioxide, silicon nitride and the like, while, in other cases, at least partially, a low-k dielectric material may be provided, in particular when the layer 210 may represent a metallization layer. The metal region 212 may have a configuration as previously explained with reference to the device 100, i.e., if required, a barrier material may be formed so as to confine a respective highly conductive metal, such as copper, copper alloys, silver, silver alloys and the like. Furthermore, an etch stop layer 213 may be provided, which may also act as a cap layer for confining the metal region 212, if other diffusion blocking mechanisms may not be provided, at least on a top layer of the metal region 212. As previously explained, silicon nitride, silicon carbide, nitrogen-containing silicon carbide, silicon dioxide and combinations thereof and the like may represent appropriate materials for the layer 213, which may actually include two or more sub-layers, depending on the overall requirements.

The metallization layer 220 may comprise a dielectric material 221, which, in one illustrative embodiment, may be provided in the form of a porous low-k material having a dielectric constant of approximately 2.8 and less. For example, a plurality of low-k dielectric materials are available, some of which are based on organic materials, while other materials may be formed on the basis of silicon, carbon, hydrogen, oxygen and the like, while a more or less porous structure of the material may result in a desired low relative permittivity thereof. Furthermore, a via opening 221A is formed in the dielectric material 221 so as to extend to the etch stop layer 213, wherein a lateral dimension of the via opening 221A may be selected in accordance with design rules for the device 200. Furthermore, a depth of the opening 221A may be substantially determined by the thickness of the dielectric layer 221 in combination with the etch stop layer 213. As previously indicated, in sophisticated applications, an aspect ratio of the opening 221A may be approximately 5 or higher.

Furthermore, the semiconductor device 200 may comprise a protection layer 223 formed of any appropriate material having an increased density and, thus, diffusion blocking effect compared to the dielectric material 221 with respect to a planarization material still to be formed above the device 200 in a further advanced manufacturing stage. The protection layer 223 may, in some illustrative embodiments, be comprised of a dielectric material, such as silicon nitride, silicon dioxide, silicon oxynitride, silicon carbide, nitrogen-containing silicon carbide and the like, with a thickness of several nanometers to approximately 10 nm or more, depending on the overall device requirements. Consequently, exposed surface portions of the material 221 may be "sealed" by the protection layer 223 prior to the deposition of a planarization material.

The semiconductor device 200 as shown in FIG. 2a may be formed on the basis of the following processes. After the fabrication of any circuit elements, which may be accomplished by well-established techniques, which may include the formation of the layer 210, when representing a part of a respective device layer, a metallization system may be formed. If, for instance, the layer 210 may represent a layer that may connect to any metal regions or contact areas, substantially the same process techniques may be used, as will be described for the metallization layer 220. That is, after forming the contact region 212 in the dielectric material 211 and depositing the etch stop layer 213 by using well-established recipes as previously described, the dielectric material 221 may be formed, for instance, by CVD, spin-on, a combination thereof and the like. Next, the dielectric material 221 may receive an etch mask, for instance, on the basis of resist material in combination with an ARC material and the like by using advanced lithography techniques. Finally, the opening 221A may be formed on the basis of well-established anisotropic etch recipes, in which the etch stop layer 213 may reliably stop the etch process. Thereafter, the device 200 may be exposed to a deposition ambient 223A, which may represent a sputter deposition ambient, a CVD deposition process, an atomic layer deposition (ALD) process, which may represent a CVD-like deposition process in which extremely thin material layers may be formed in a self-limiting manner, electroless deposition techniques and the like. For example, the deposition ambient 223A may be established on the basis of precursor materials so as to deposit the layer 223 in the form of a dielectric material, which may have an increased dielectric constant and thus an increased density to enhance or substantially maintain integrity of the dielectric material 221 during the further processing. As previously indicated, the material 221 may be provided in the form of a porous low-k material, which may be accomplished by depositing the material 221 per se in a substantially porous state or by treating the material 221 after deposition by radiation and/or heat to initiate out-diffusion of respective porogens, thereby creating the desired degree of porosity. In this case, the irregular surface of the dielectric material 221 may be smoothed and sealed by the protection layer 223, thereby substantially avoiding a mutual interaction between the dielectric material 221 and a subsequently formed planarization material.

Figure 2B:
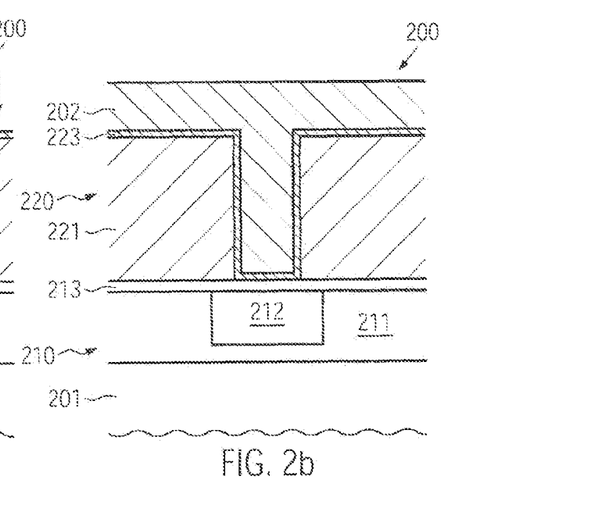

FIG. 2b schematically illustrates the semiconductor device 200 in a further advanced manufacturing stage in which a planarization material 202 may be formed in the opening 221A and above the dielectric material 221, wherein the protection layer 223 may prevent a direct contact between the materials 221 and 202, as previously explained. Consequently, the planarization layer, which may be provided in the form of an organic material, may be deposited on the basis of well-established process techniques, thereby providing a high degree of compatibility with conventional strategies as previously described.

Figure 2C:
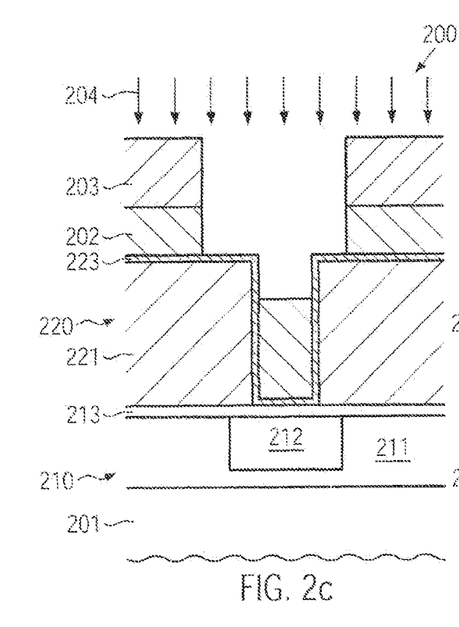

FIG. 2c schematically illustrates the semiconductor device 200 in a further advanced manufacturing stage in which an etch mask 203 is formed above the planarization material 202, which may be patterned on the basis of the mask 203 so as to define a respective trench opening therein. In some illustrative embodiments, a respective etch process may comprise an additional etch step for etching through the protection layer 223, if the etch chemistry used for patterning the planarization layer 202 may have a reduced removal rate with respect to the material of the protection layer 223. In other cases, respective etch stop capabilities of the protection layer 223 may be used to provide enhanced uniformity, since the actual trench patterning process may be performed with a high degree of uniformity across the substrate 201 when using the protection layer 223 as etch stop material, which may then be separately opened with a high degree of controllability.

Figure 2D:
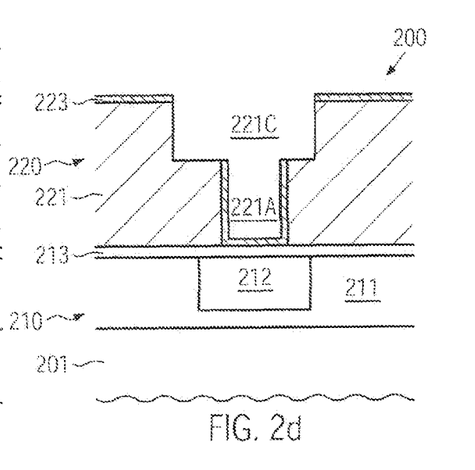

FIG. 2d schematically illustrates the semiconductor device 200 after the end of the patterning process 204 and respective processes for removing portions of the mask 203 and the planarization material 202 which may be accomplished by well-established recipes, thereby forming a trench 221C connected to the via opening 221A. It should be appreciated that, in some illustrative embodiments, the process of removing the etch mask 203 in combination with the material 202 may be combined with the process of deepening the via opening 221A so as to finally etch through the cap layer 213 at the bottom of the opening 221A. For instance, during oxygen plasma strip processes, a defined amount of fluorine may be added to the plasma ambient, thereby etching through the stop layer 213 in a highly controllable manner. During the corresponding etch process, the protection layer 223 may also be removed from the bottom of the via opening 221A, while enhanced integrity of the sidewalls of via opening 221A may be achieved due to the presence of the protection layer 223. In other cases, after the removal of the etch mask 203 and the material 202, the protection layer 223 may be removed on the basis of a specifically designed etch ambient, for instance, a wet chemical treatment and the like, so as to expose all surface portions of the dielectric material 221 and the etch stop layer 213 at the bottom of the via opening 221A. For example, a plurality of highly selective etch recipes are available for a plurality of conventional dielectrics, such as silicon dioxide, silicon nitride and the like. In other cases, the protection layer 223 may be removed, at least from horizontal portions, on the basis of a plasma ambient with a more or less pronounced degree of directionality, thereby maintaining the protection layer 223 partially at sidewalls of the via opening 221A. Thus, an increased degree of flexibility may be accomplished in the overall process flow during the further processing, since the protection layer 223 may be substantially completely removed, if a high degree of compatibility with conventional process strategies may be desired, while, in other cases, increased integrity of at least sidewall portions of the vias may be obtained, if desired. Depending on the type of material used for the protection layer 223, consequently, a reduced thickness for a barrier material may be sufficient, while enhanced deposition conditions may also be achieved, at least in the via opening 221A, since the protection layer 223 may have improved surface conditions compared to the dielectric material 221, in particular when a porous low-k material is considered.

Figure 2E:
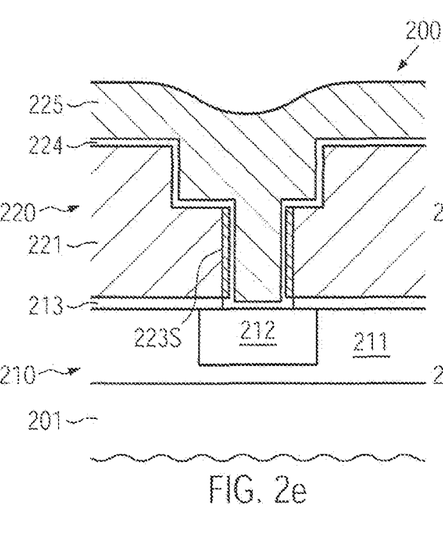

FIG. 2e schematically illustrates the semiconductor device 200 in a further advanced manufacturing stage. As shown, a conductive barrier material 224, for instance in the form of tantalum, tantalum nitride and the like, may be formed in the via opening 221A and the trench 221C (see FIG. 2d), and a metal layer 225 is formed within the openings 221A, 221C and above the dielectric material 221. For instance, the metal layer 225 may be comprised of copper, copper alloys, silver and the like. The barrier material 224 may be formed on the basis of well-established techniques, such as sputter deposition, CVD, electroless plating and the like, depending on the process requirements. Similarly, the metal layer 225 may be formed on the basis of any desired deposition technique, wherein the via opening 221A and the trench 221C may be filled in a common process sequence. For instance, electroplating techniques may be used, wherein, if required, a seed layer may be formed on the barrier material 224 prior to actually depositing the layer 225 by electro-chemical deposition techniques. As previously explained, on sidewall portions of the via opening 221A, residuals of the protection layer 223, indicated as 223S, may still be present, depending on the overall process strategy. For example, the residual layer 223S may be considered as a sidewall spacer, which may provide enhanced deposition conditions, in particular, at the critical sidewall portions of the via opening 221A. Thus, in general, a reduced thickness of the barrier material 224 may be used, due to the enhanced surface conditions provided by the spacers 223S. In addition, in some illustrative embodiments, the spacers 223S may themselves provide a metal-confining effect, thereby relaxing the constraints with respect to a thickness of the barrier layer 224 at the sidewalls of the via opening 221A. For example, silicon carbide, nitrogen-containing silicon carbide, silicon nitride and the like may be used as efficient copper-confining materials, which may thus allow the deposition of the layer 224 with reduced thickness, since a reliable coverage at the sidewall portions may be less critical. In other illustrative embodiments, the protection layer 223 may be provided in the form of a conductive barrier material, such as tantalum, tantalum nitride and the like, thereby also providing a desired copper-confining effect while not unduly reducing the overall conductivity of the metal-containing via 221A.

After the process sequence for commonly filling the via opening 221A and the trench 221C, excess material of the layer 225 and the barrier layer 224 may be removed, for instance, on the basis of well-established techniques, such as CMP and the like, thereby forming a metal line in the trench 221C and the via 221A. Thereafter, further metallization levels may be formed, for instance, on the basis of the process techniques described with reference to the metallization layer 220, thereby also providing the advantage of a reduced interaction of the dielectric material with a planarization material, while nevertheless achieving a highly efficient process flow with respect to commonly filling the via opening and the trench, as previously described.

With reference to FIGS. 2f-2k, further illustrative embodiments will now be described in which the patterning of the via opening 221A may be modified so as to extend down to the contact region 212, prior to patterning the trench in the upper portion of the dielectric material 221.

Figure 2F:
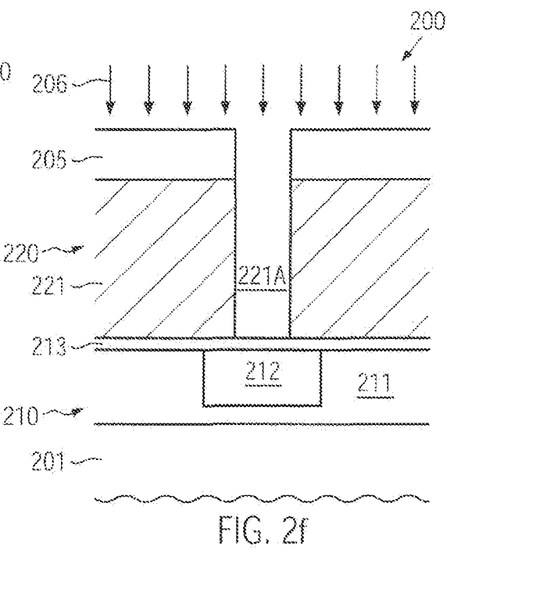
FIGS. 2f-2k schematically illustrate cross-sectional views of the semiconductor device during various manufacturing stages, in which a via opening may be patterned down to an underlying metal region prior to the deposition of a protection layer, according to further illustrative embodiments.

FIG. 2f schematically illustrates the semiconductor device 200 after the patterning of the via opening 221A in the material 221 on the basis of an appropriate mask 205, wherein the patterning process may be controlled or stopped on the basis of the etch stop layer 213. Furthermore, the device 200 is subjected to a further etch step 206 for etching through the etch stop layer 213, for instance, by concurrently removing the etch mask 205 on the basis of an oxygen plasma including a fluorine component and the like. For example, during the removal of the etch mask 205, a specified amount of fluorine may be present in the etch ambient 206, thereby etching through the layer 213 in a highly controllable manner, while, in other cases, the etch mask 205 may be removed prior to or after the etch process 206 for opening the layer 213.

Figure 2G:
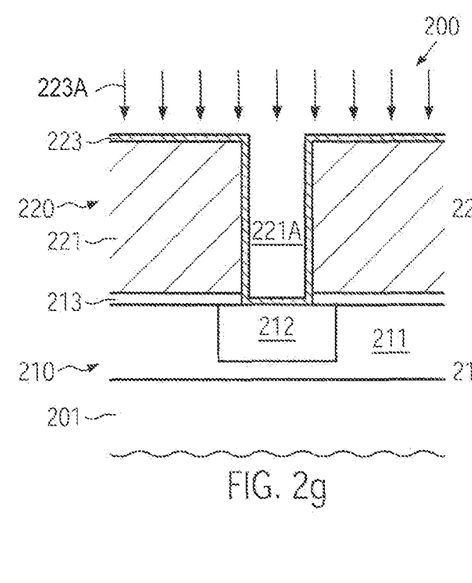

FIG. 2g schematically illustrates the device 200 after the etch process 206 and during the deposition process 223A so as to provide the protection layer 223 with a desired material composition and thickness. In one illustrative embodiment, the protection layer 223 may be provided in the form of an appropriate dielectric material of reduced thickness of approximately of 5-50 nm, thereby also forming a cap material on the exposed portion of the contact region 212, which may therefore provide a reduced and well-controlled thickness at the bottom of the opening 221A in a later manufacturing stage. In still other illustrative embodiments, the protection layer 223 may be formed as a conductive barrier material, thereby passivating the sidewalls of the via opening 221A and also the exposed portion of the contact region 212. For instance, the deposition process 223A may comprise a sputter deposition process, an electroless deposition process and the like so as to form the protection layer 223 from any appropriate conductive barrier material, such as tantalum, tantalum nitride and the like. Thereafter, further processing may be continued, for instance, by forming an etch mask including a trench opening, as previously described, and performing a patterning process as described above.

Figure 2H:
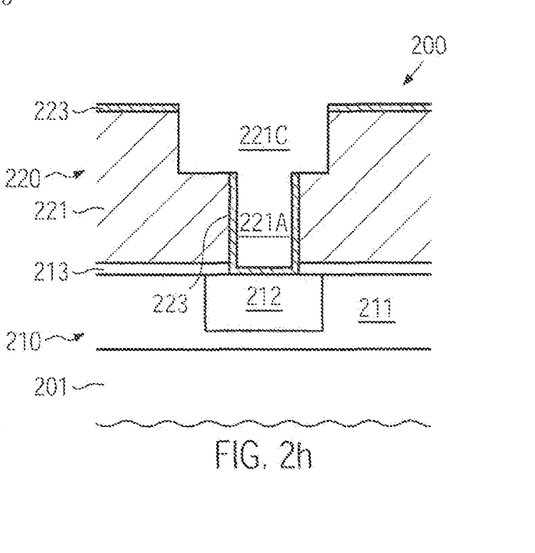

FIG. 2h schematically illustrates the semiconductor device 200 with the trench 221C formed in the upper portion of the dielectric material 221 and with the via opening 221A, the surface portions of which are still covered by the protection layer 223.

Figure 2I:
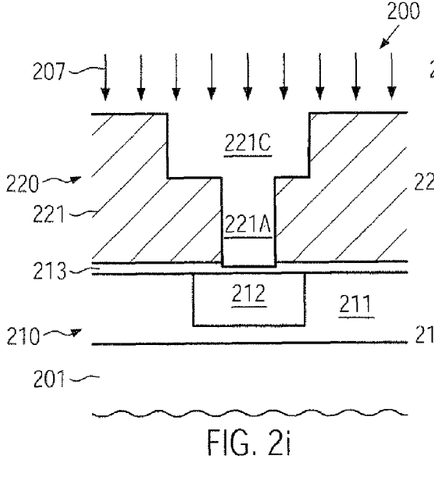

FIG. 2i schematically illustrates the semiconductor device 200 according to illustrative embodiments in which the remaining material of the protection layer 223 may be removed by an etch process 207, when the presence of the protection layer 223 may be considered inappropriate for the further processing of the device 200. For example, if comprised of a dielectric material, the bottom of the via opening 221A may be removed during the process 207, thereby connecting the via opening 221A to the contact region 212, while also removing the portions on the sidewalls of the via opening 221A and on the horizontal portions of the material 221. Due to the reduced thickness of the protection layer 223, the corresponding act of exposing the contact region 212 may be accomplished with a high degree of uniformity, while also reducing the degree of exposure of the trench 221C to a reactive ambient, i.e., the etch ambient 207. Thereafter, the further processing may be continued by commonly depositing a barrier material and a highly conductive metal for the openings 221A and 221C, as previously described. It should be appreciated that, in other illustrative embodiments, the etch process 207 may be established on the basis of a substantially anisotropic etch recipe, thereby substantially removing portions of the layer 223 from horizontal areas, i.e., the bottom of the via 221A and the horizontal portions of the dielectric material 221, while substantially maintaining "sidewall spacers" at the sidewalls of the via opening 221A. Also, in this case, enhanced integrity of the trench 221C may be accomplished, in combination with imposing less restrictive constraints on the subsequent deposition of a barrier material, as previously explained.

In other illustrative embodiments, the protection layer 223 may be comprised of a conductive barrier material and the further processing of the device 200 as shown in FIG. 2h may be continued on the basis of the deposition of the barrier material followed by the deposition of a highly conductive metal.

Figure 2J:
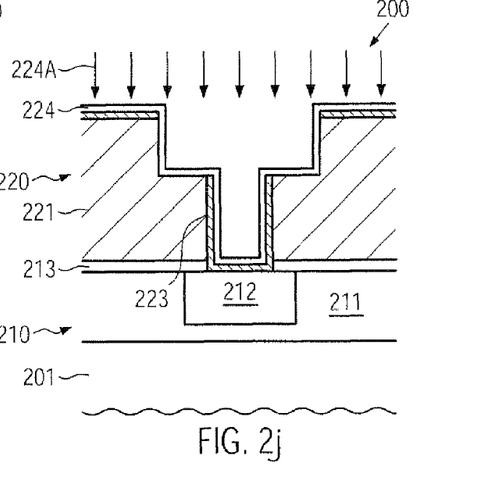

FIG. 2j schematically illustrates the device 200 during a deposition process 224A for forming the barrier layer 224, wherein a thickness thereof may be reduced compared to conventional strategies, since the barrier layer 224 has to be formed substantially in the trench 221C, in which less critical deposition conditions may prevail, compared to the via opening 221A, in which a reliable coverage may already be established by the protection layer 223.

Figure 2K:
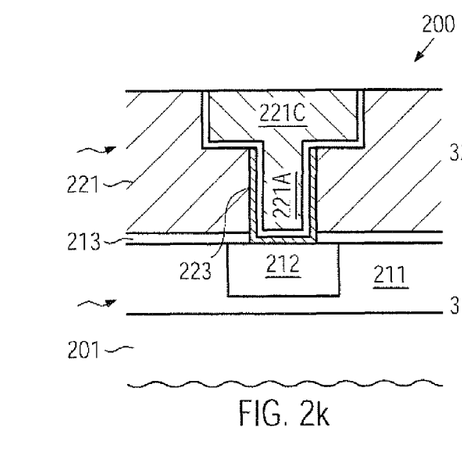

FIG. 2k schematically illustrates the semiconductor device 200 in a further advanced manufacturing stage, i.e., after the deposition of a highly conductive metal and the removal of any excess material thereof and of excess material of the barrier layers 224 and the protection layer 223, when provided in the form of a conductive material. As illustrated, a metal line, which for convenience is also indicated by reference sign 221C, is provided in an upper portion of the dielectric material 221, while a via, also indicated by reference sign 221A, is formed in a lower portion so as to connect the metal line 221C with the contact region 212. Furthermore, the via 221A may comprise portions of the protection layer 223 and the barrier layer 224, which may, if desired, be provided with a reduced thickness compared to conventional strategies, as previously described with reference to the device 100.

Consequently, a high degree of compatibility with conventional process solutions may be maintained while nevertheless enhanced conditions during the patterning of the trenches for sophisticated metallization layers may be accomplished by providing the protection layer 223, which may be removed or which may be maintained partially during the further processing, thereby even further enhancing the overall process sequence.

With reference to FIGS. 3a-3j, further illustrative embodiments will now be described in which the provision of a conventional planarization material may be avoided by performing the patterning sequence for forming the via opening and the trench in separate steps, while nevertheless filling these openings in a common fill sequence.

Figure 3A:
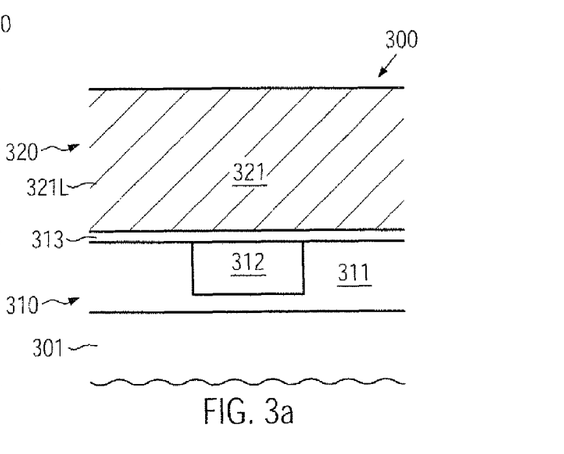
FIGS. 3a-3e schematically illustrate cross-sectional views of a semiconductor device during various manufacturing stages in forming a metallization layer by first patterning a via in a first sub-layer and subsequently forming a second dielectric sub-layer and patterning trench openings therein and filling both openings in a common process sequence, according to still further illustrative embodiments.

FIG. 3a schematically illustrates a semiconductor device 300 comprising a substrate 301, above which may be formed a device layer or metallization layer 310 including a contact region or metal region 312 embedded into a dielectric material 311. Furthermore, an etch stop layer 313 may be formed above the dielectric material 311 and the contact region 312. With respect to the components described so far, the same criteria apply as previously explained with reference to the devices 100 and 200. Furthermore, a dielectric material 321L, representing a lower portion of a dielectric layer of a metallization layer 320, may be formed on the etch stop layer 313. For example, the dielectric material 321L may be provided in the form of any appropriate dielectric material, such as a conventional dielectric material in the form of silicon dioxide and the like, while, in other cases, a material of reduced permittivity may be used, which, however, may have a different etch behavior with respect to a further dielectric material still to be formed on or above the layer 320. For example, the material 321L may be provided in the form of a fluorine-doped silicon dioxide material, a silicon, carbon, hydrogen, oxygen-containing material and the like.

The semiconductor device 300 as shown in FIG. 3a may be formed by well-established process techniques, as previously described, wherein the dielectric material 321L may be formed with a thickness that substantially corresponds, in combination with the thickness of the etch stop layer 313, to the depth of a corresponding via to be formed in the material 321L.

Figure 3B:
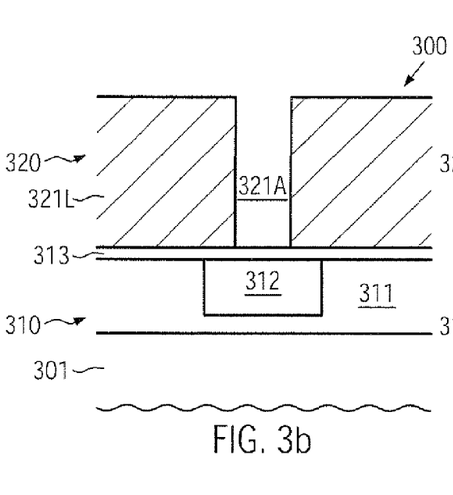

FIG. 3b schematically illustrates the semiconductor device 300 in a further advanced manufacturing stage, i.e., during the patterning of the dielectric layer 321L so as to obtain a via opening 321A. The patterning may be accomplished on the basis of well-established techniques, wherein, however, contrary to the previously described approaches, a significantly reduced aspect ratio may have to be taken into consideration due to the reduced thickness of the layer 321L, compared to the previously described dielectric layers 121 and 221. Thus, enhanced process uniformity and/or reduced complexity with respect to process control may be achieved during the patterning of the via opening 321A.

Figure 3C:
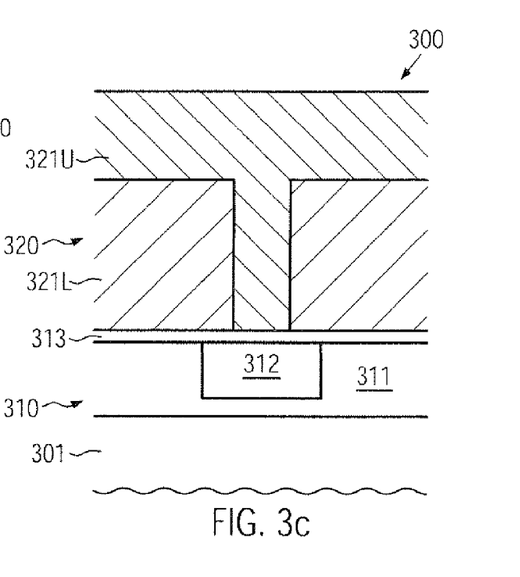

FIG. 3c schematically illustrates the semiconductor device 300 with a further dielectric material 321U, which may represent an upper portion of the dielectric material of the metallization layer 320, in which a trench is to be formed. The dielectric material 321U may be provided in the form of a low-k dielectric material, such as appropriate materials having a dielectric constant of 2.8 and significantly less, which may be deposited by any appropriate depositions technique, for instance, by spin-on processes and the like. During the deposition of the low-k dielectric material 321U, the via opening 321A may also be filled, thereby planarizing the overall surface topography, wherein, in some illustrative embodiments, additional planarization steps may be performed on the basis of appropriately designed etch steps, CMP steps and the like. As previously indicated, the materials 321L and 321U may have significantly different material characteristics, at least with respect to a specified etch recipe designed to form a trench at least in the material 321U. For example, fluorine-doped silicon dioxide may have a significantly reduced removal rate compared to a plurality of ultra low-k dielectrics, thereby providing a desired high etch selectivity.

Figure 3D:
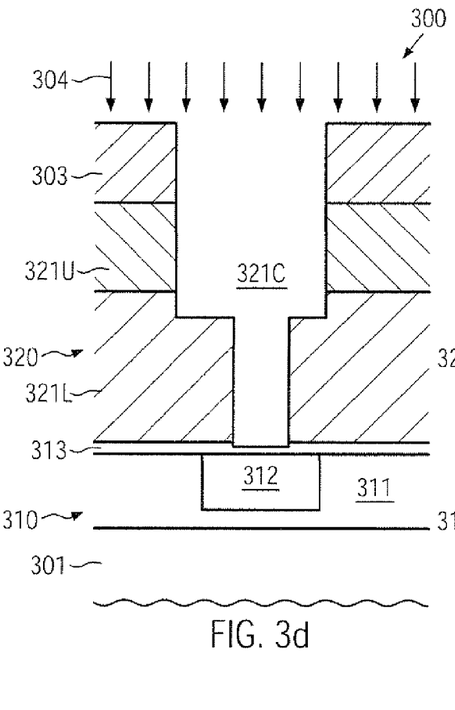

FIG. 3d schematically illustrates the semiconductor device 300 during an etch process 304 performed on the basis of an etch mask 303 so as to form a trench 321C at least in the portion 321U. Due to the significant different removal rates of the materials 321U, 321L during the etch process 304, the material of the layer 321U within the via opening 321A may be increasingly removed when the etch front reaches the interface between the layers 321U, 321L, while the further progress of the etch front in the layer 321L may be significantly reduced. Thus, the via opening 321A may be "reopened," while only a moderately low penetration of the trench 321C into the layer 321L may occur. After the etch process 304, the etch mask 303 may be removed on the basis of well-established process techniques, while the bottom of the via opening 321A may also be opened. Thereafter, the further processing may be continued by depositing a barrier material followed by the deposition of a highly conductive metal so as to commonly fill the via opening 321A and the trench 321C.

Figure 3E:
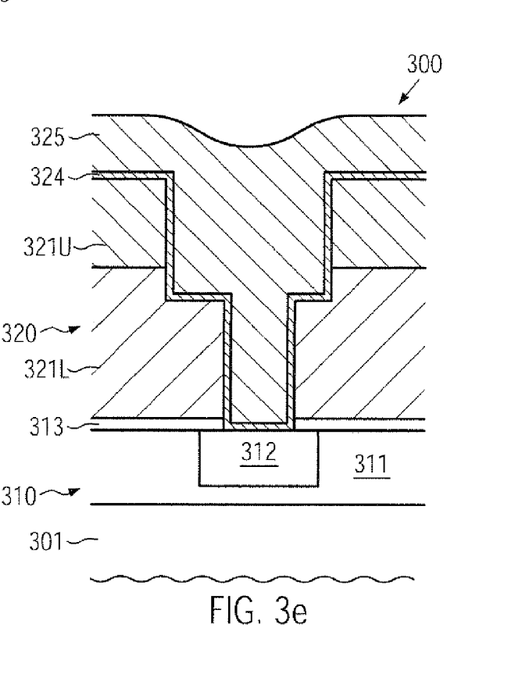

FIG. 3e schematically illustrates the semiconductor device 300 after the completion of the above-described process sequence. A barrier layer 324 covers exposed portions of the trench 321C and the via opening 321A, and a metal layer 325, such as a copper layer, may reliably fill the openings 321A, 321C. Thereafter, the further processing may be continued by removing any excess material of the layers 325 and 324, as previously explained.

Figure 3F:
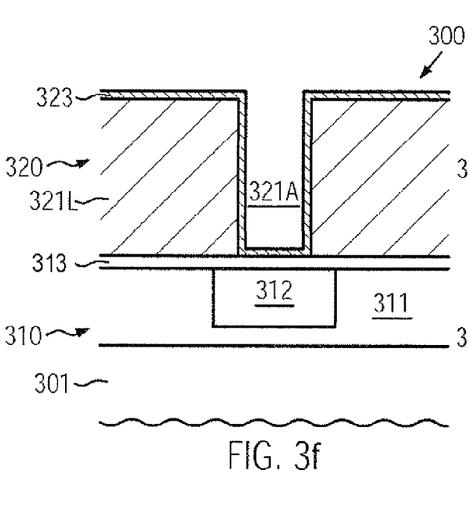
FIGS. 3f-3j schematically illustrate cross-sectional views of the semiconductor device during various manufacturing stages in which, additionally, an etch stop layer may be formed prior to forming the second sub-layer for the trench patterning sequence, according to still other illustrative embodiments.

FIG. 3F schematically illustrates the semiconductor device 300 after patterning the via opening 321A in the dielectric material 321L, for instance, on the basis of process techniques as previously described. Furthermore, an etch stop layer 323 may be formed on exposed portions of the material 321L and within the via opening 321A. The etch stop layer 323 may be provided in the form of any appropriate dielectric material having a desired high etch selectivity with respect to the dielectric material of the layer 321U still to be formed. For instance, the etch stop layer 323 may be comprised of silicon nitride, silicon carbide, nitrogen-containing silicon carbide, silicon dioxide, silicon oxynitride, depending on the overall process and device requirements. The etch stop layer 323 may be formed on the basis of any suitable deposition technique, such as CVD, wherein one or more material layers may be deposited so as to obtain the desired etch stop capabilities.

Figure 3G:
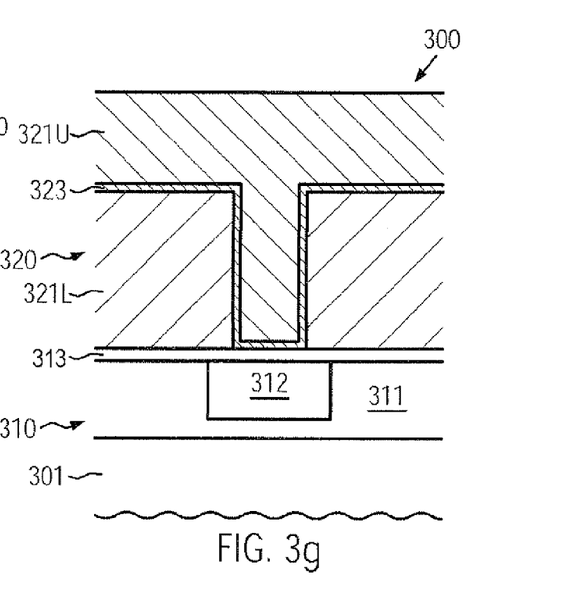

FIG. 3g schematically illustrates the semiconductor device 300 after the deposition of the layer 321U, which may be accomplished by any appropriate deposition technique, as described above. It should be appreciated that, due to the presence of the etch stop layer 323, a high degree of flexibility may be achieved with respect to the selection of appropriate material characteristics for the layers 321L, 321U. That is, since a pronounced etch selectivity between the layers 321L, 321U may no longer be required, the material composition may be selected in view of other device criteria, such as overall permittivity, compatibility with further processes and the like. For instance, in this case, the layers 321L, 321U may be provided as substantially the same material, thereby achieving a low overall permittivity, while, in other cases, any other material combination may be used irrespective of the etch behavior thereof.

Figure 3H:
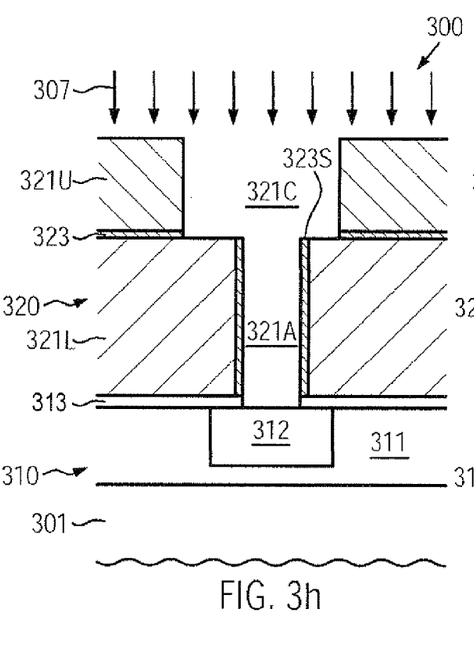

FIG. 3h schematically illustrates the device 300 after patterning the trench 321C, which may be accomplished on the basis of any appropriate anisotropic etch recipe, wherein the etch stop layer 323 may substantially avoid undue material removal in the layer 321L, while "reopening" the via opening 321A. Thereafter, a further etch step 307 may be performed to remove the dielectric material at the bottom of the via opening 321A, wherein material 323 may also be removed from the bottom of the trench 321C. In some illustrative embodiments, the process 307 may be performed as a substantially anisotropic etch process, thereby substantially maintaining respective sidewall spacers 323S, which may also provide enhanced deposition conditions for forming a barrier layer, as previously explained with reference to the device 200. In other illustrative embodiments, the etch process 307 may comprise a substantially isotropic etch step, thereby also removing or at least significantly reducing the material of the layer 323 at the sidewalls of the via opening 321A.

Figure 3I:
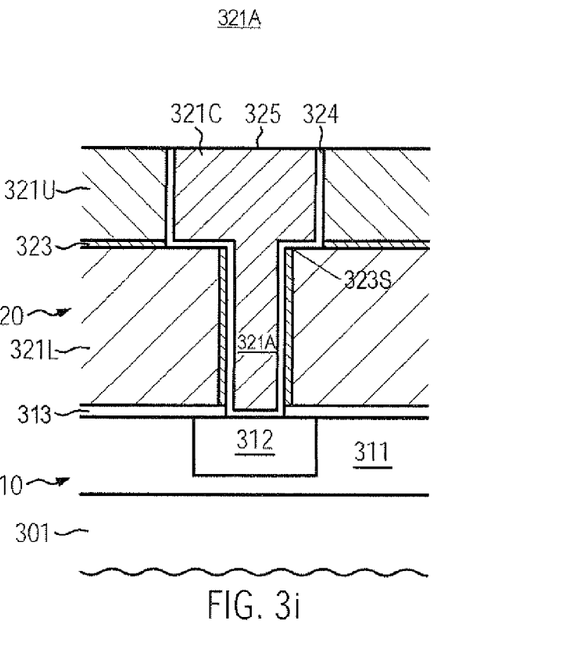

FIG. 3i schematically illustrates the semiconductor device 300 in a further advanced manufacturing stage. As illustrated, a metal line, also indicated by reference sign 321C, is formed in the layer 321U, while the via 321A is formed in the layers 321L, 313 wherein, in the embodiments shown, the sidewall spacers 323S may be formed in the via 321A. Furthermore, the etch stop layer 323 may separate the dielectric materials of the layers 321L, 321U. The device 300 as shown in FIG. 3i may be formed on the basis of well-established process techniques, i.e., the barrier material 324 may be formed in a common manufacturing sequence for the metal line 321C and the via 321A and similarly the highly conductive metal 325 may also be formed in a common fill sequence for the metal line 321C and the via 321A.

Figure 3J:
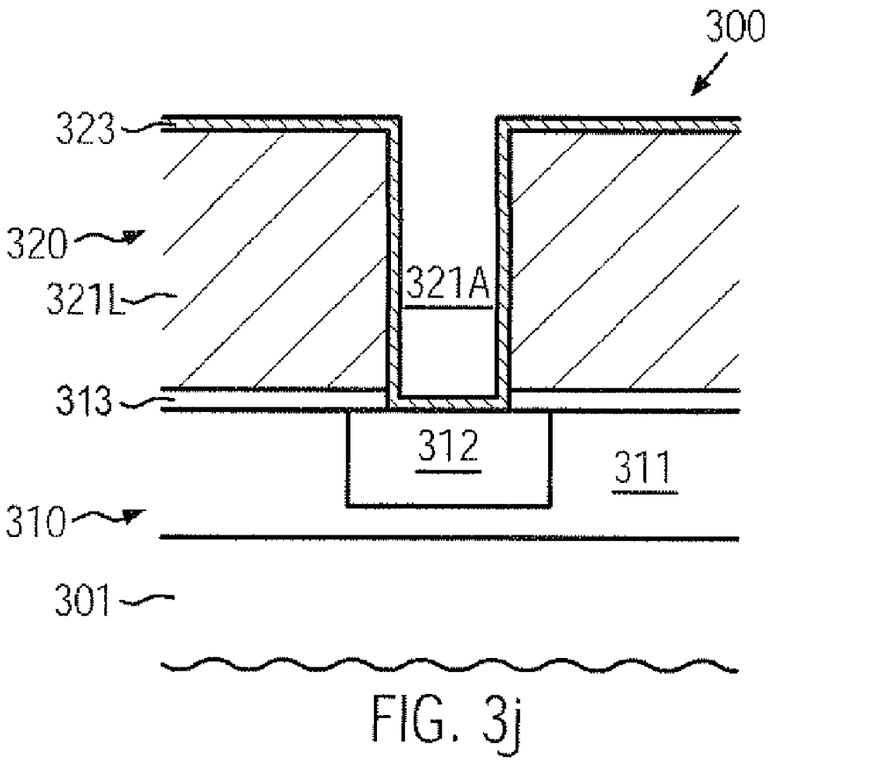

FIG. 3j schematically illustrates the semiconductor device 300 according to further illustrative embodiments in which the via opening 321A may be formed in the layer 321L so as to extend down to the contact or metal region 312, followed by the deposition of the etch stop layer 323 so as to cover an exposed portion of the contact region 312. As previously explained, also in this case, the opening of the etch stop layer 313 may be performed in an early manufacturing stage on the basis of less critical process conditions, while the subsequent deposition of the etch stop layer 323 may provide a reduced but well-controlled thickness, which may enhance the overall integrity of the trench 321C (see FIG. 3h) during the etch process 307 for exposing the contact region 312. That is, during the etch process 307, only the reduced thickness of the etch stop layer 323 may have to be opened at the bottom of the via 321A, thereby reducing the time of exposure of the trench 321C to the etch ambient of the process 307. Thereafter, the further processing may be continued, as described above.

As a result, the usage of conventional planarization materials during the patterning of the trenches may be avoided by performing the patterning sequence for a via opening and a trench in separate steps, while nevertheless maintaining a common fill process, thereby reducing constraints with respect to the patterning of the via opening due to the reduced aspect ratio, while nevertheless providing enhanced efficiency of the overall process flow. Also, undue interaction of a low-k dielectric material and organic components, such as a solvent of conventional planarization materials, may be avoided according to the process strategy described with reference to FIGS. 3a-3j. In other cases, a significant reduction or a substantially complete avoidance of an interaction of a conventional planarization material with a low-k dielectric material, in particular a porous low-k material, may be accomplished by providing a protection layer prior to applying the planarization material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a via opening in a low-k dielectric layer formed above a substrate of a semiconductor device;
    forming a protection layer on exposed surface portions of said low-k dielectric layer, said protection layer covering an upper surface of said low-k dielectric layer and sidewall surfaces of said via opening;
    forming a planarization material on said protection layer, said planarization material filling said via opening and covering said upper surface of said low-k dielectric layer;
    forming a trench opening in said planarization material formed above said upper surface of said low-k dielectric layer while removing a first portion of said planarization material from said via opening, wherein said trench opening is positioned above said via opening; and
    forming a trench in said low-k dielectric layer on the basis of said trench opening in said planarization material.

2. The method of claim 1, wherein forming said protection layer comprises forming a dielectric material on said exposed surface portions.

3. The method of claim 1, wherein forming said protection layer comprises forming a conductive material on said exposed surface portions and removing a portion of said conductive material outside said via opening after forming said trench.

4. The method of claim 1, further comprising removing said protection layer in said via opening after forming said trench.

5. The method of claim 1, further comprising filling said via opening and said trench with a metal in a common fill process.

6. The method of claim 5, further comprising forming a conductive barrier layer at least in said trench prior to filling said via opening and said trench with a metal.

7. The method of claim 1, further comprising, after forming said trench in said low-k dielectric layer, removing remaining portions of said planarization material and deepening said via opening so as to extend to a metal region.

8. The method of claim 1, wherein said via opening is formed so as to extend to a metal region located below said low-k dielectric layer.

9. The method of claim 8, further comprising forming a conductive barrier layer on a portion of said metal region exposed by said via opening.

10. The method of claim 1, further comprising forming a conductive barrier layer inside of said trench and said via opening prior to filling said trench and said via opening with said metal.

11. The method of claim 10, wherein said conductive barrier layer is formed on said protection layer inside of said via opening.

12. The method of claim 1, wherein forming said trench opening in said planarization material comprises forming a patterned etch mask above said planarization material.

13. The method of claim 1, wherein forming said trench opening in said planarization material comprises using said protection layer as an etch stop layer.

14. A method, comprising:
    forming a layer of low-k dielectric material above a metallization layer of a semiconductor device;
    forming via opening is said layer of low-k dielectric material and above a contact region formed in said metallization layer;
    forming a protection layer above said semiconductor device, said protection layer covering an upper surface of said layer of low-k dielectric material and sidewall and bottom surfaces of said via opening;
    forming a layer of planarization material above said semiconductor device, said layer of planarization material filling said via opening and covering said upper surface of said layer of low-k dielectric material;
    forming an etch mask above said layer of planarization material;
    forming trench opening in said etch mask and said layer of planarization material formed above said upper surface of said layer of low-k dielectric layer while removing a first portion of said planarization material from said via opening, wherein said trench opening is positioned above said via opening;
    forming a trench in said layer of low-k dielectric layer using said trench opening as a mask; and
    exposing said contact region in said metallization layer.

15. The method of claim 14, wherein said protection layer is formed on and in contact with at least said upper surface of said layer of low-k dielectric material and said sidewall surfaces of said via opening.

16. The method of claim 14, further comprising removing said protection layer from said sidewall and bottom surfaces of said via opening after forming said trench in said layer of low-k dielectric material.

17. The method of claim 14, further comprising forming a barrier layer inside of said trench and via openings.

18. The method of claim 17, wherein forming said barrier layer inside of said via opening comprises forming said barrier layer on at least said protection layer formed on said sidewalls of said via opening.

19. The method of claim 17, wherein forming said barrier layer inside of said via opening comprises forming said barrier layer on at least said exposed contact region.

20. The method of claim 14, further comprising filling said trench and via openings with a conductive material during a common material deposition process.

21. The method of claim 14, wherein forming said trench opening in said etch mask and said layer of planarization material comprises using said protection layer as an etch stop layer.

* * * * *